United States Patent
Meyer-Berg et al.

(10) Patent No.: US 9,123,544 B2
(45) Date of Patent: Sep. 1, 2015

(54) SEMICONDUCTOR DEVICE AND METHOD (75) Inventors: Georg Meyer-Berg, Munich (DE); Christian Birzer, Burglengenfeld (DE)

(73) Assignee: Infineon Technologies AG, Neubiberg (DE)

( * ) Notice: Subject to any disclaimer, the term of this patent is extended or adjusted under 35 U.S.C. 154(b) by 597 days.

(21) Appl. No.: 13/278,681

(22) Filed: Oct. 21, 2011

(65) Prior Publication Data
US 2013/0099383 A1 Apr. 25, 2013

(51) Int. Cl.
H01L 23/48 (2006.01)
H01L 23/52 (2006.01)
H01L 29/40 (2006.01)
H01L 23/00 (2006.01)
H01L 23/522 (2006.01)
H01L 23/528 (2006.01)

(52) U.S. Cl.
CPC .............. H01L 24/05 (2013.01); H01L 23/528 (2013.01); H01L 23/5226 (2013.01); H01L 24/13 (2013.01); H01L 2224/0235 (2013.01); H01L 2224/02375 (2013.01); H01L 2224/0401 (2013.01); H01L 2224/056 (2013.01); H01L 2224/05008 (2013.01); H01L 2224/058 (2013.01); H01L 2224/05012 (2013.01); H01L 2224/05014 (2013.01); H01L 2224/0579 (2013.01); H01L 2224/05552 (2013.01); H01L 2224/05557 (2013.01); H01L 2224/05562 (2013.01); H01L 2224/05567 (2013.01); H01L 2224/05569 (2013.01); H01L 2224/05572 (2013.01); H01L 2224/131 (2013.01); H01L 2224/13007 (2013.01); H01L 2224/13022 (2013.01)

(58) Field of Classification Search
None
See application file for complete search history.

(56) References Cited

U.S. PATENT DOCUMENTS

| 6,583,040 B1 * | 6/2003 | Lin ................................ 438/612 |
| 6,815,621 B2 | 11/2004 | Park et al. |
| 6,822,327 B1 | 11/2004 | Mithal et al. |
| 7,825,024 B2 | 11/2010 | Lin et al. |
| 2009/0095519 A1 | 4/2009 | Daubenspeck et al. |
| 2009/0283903 A1 | 11/2009 | Park |
| 2010/0263913 A1 | 10/2010 | Daubenspeck et al. |
| 2013/0087909 A1 * | 4/2013 | Abdul Razak ................ 257/737 |

FOREIGN PATENT DOCUMENTS

| CN | 1346149 A | 4/2002 |
| CN | 101740484 A | 2/2009 |
| CN | 101924019 A | 12/2010 |
| JP | 2004363319 A | 12/2004 |

* cited by examiner

Primary Examiner — Sonya D McCall Shepard
(74) Attorney, Agent, or Firm — Slater & Matsil, L.L.P.

(57) ABSTRACT

An electrical device includes a semiconductor chip. The semiconductor chip includes a routing line. An insulating layer is arranged over the semiconductor chip. A solder deposit is arranged over the insulating layer. A via extends through an opening of the insulating layer to electrically connect the routing line to the solder deposit. A front edge line portion of the via facing the routing line is substantially straight, has a concave curvature or has a convex curvature of a diameter greater than a maximum lateral dimension of the via.

13 Claims, 8 Drawing Sheets

SEMICONDUCTOR DEVICE AND METHOD

TECHNICAL FIELD

The present invention generally relates to techniques for designing electrical structures such as routing lines, vias, conductor tracks and terminals in electrical devices, and more particularly to techniques for interconnecting routing lines to vias and/or for interconnecting conductor tracks to electrical contacts such as, e.g., bond pads.

BACKGROUND

A variety of techniques are known to route electrical signals in electrical devices. Typically, chip internal routing lines are used to transport electrical signals and/or electrical power from one location to another location of the chip. Routing lines may be connected to conductive vias passing through an insulating layer arranged over the chip to provide interconnections to solder deposits arranged over the insulating layer. The interconnections between the conductive vias forming part of a conductive redistribution structure (RDL) and the solder deposits are subjected to electromigration, i.e., the transport of material caused by the current flowing through the interconnection. Electromigration may adversely effect mechanical stability of the interconnection and lifetime of the electrical device.

Further, electromigration may occur where conductor tracks of a conductive redistribution structure connect to electrical contact pads.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together unless stated otherwise. Intervening elements may be provided between the "coupled" or "electrically coupled" elements.

Some of the electrical devices described herein contain one or more semiconductor chips. The semiconductor chips may be of different types, may be manufactured by different technologies and may include, for example, integrated electrical, electro-optical or electro-mechanical circuits and/or passives. The semiconductor chips may, for example, be designed as logic integrated circuits, analog integrated circuits, mixed signal integrated circuits, power integrated circuits, memory circuits or integrated passives. They may include control circuits, microprocessors or microelectromechanical components. The semiconductor chips need not be manufactured from specific semiconductor material, for example, Si, SiC, SiGe, GaAs, AlGaAs and, furthermore, may contain inorganic and/or organic materials that are not semiconductors, such as, for example, insulators, plastics or metals.

Some of the electrical devices described herein comprise a semiconductor chip having chip internal routing lines which allow electrical connections to be made between integrated circuits of the semiconductor chip and chip external electrical components. The routing lines may be made of a conductive material such as, e.g., a metal. Any desired metal or metal alloy, for example, aluminum or copper, may be used as the material. The routing lines need not be homogenous or manufactured from just one material, that is to say various compositions and concentrations of the materials or layers of different materials contained in the routing line are possible. The routing lines are arranged within a semiconductor chip to form part of the internal chip wiring. By way of example, the routing lines may be formed in the so-called last metal layer of the semiconductor chip. A line section of the routing lines may have, for example, the form of a curved or straight line or stripe. Semiconductor processing technologies may be applied to generate and/or structure the routing lines.

In one embodiment, an insulating layer may be arranged over the semiconductor chip. The insulating layer may comprise a hard passivation layer and/or a polymer layer. The hard passivation layer may, e.g., be made of an oxide or nitride layer covering the bare semiconductor material surface. The polymer layer may, e.g., be made of a photoresist or of any other etching resist. The insulating layer may be used to electrically insulate a section of the routing line against, e.g., an electrically conductive layer covering the insulating layer. The insulating layer may comprise an opening for the via. Thin-film technologies may be applied to generate and/or structure the insulating layer.

An electrically conductive layer may be arranged above the insulating layer. The conductive layer may form part of a conductive redistribution structure (RDL). The conductive layer may be structured to comprise electrical contact pads and/or conductor tracks. It may, e.g., comprise metal, metal alloy or a conducting polymer material. A further insulating layer overlaying the conductive layer may be used as a solder stop layer.

Insulating layer(s) and/or conductor track(s) and/or electrical contact pad(s) and/or via(s) may be applied during wafer level processing, that is during frontend processing. By way of example, a polymer layer may be applied by a CVD (Chemical Vapor Deposition) process or by a spin coating process. The polymer layer may be made of a photoresist or of any other etching resist. Conductor track(s) and/or via(s) and/or electrical contact pad(s) may be formed from one or more conductive layers. In one embodiment, a conductive layer may comprise a seed layer and a further layer which is galvanically deposited ("plated") onto the seed layer. In one embodiment, an electroless plating process such as electroless nickel-palladium plating may be used. Electroless plating is also referred to as chemical plating in the art. Further, other deposition methods such as physical vapor deposition (PVD), chemical vapor deposition (CVD), sputtering, spin-on processes, spray deposition or printing such as, e.g., screen printing or ink-jet printing may be employed to form the conductive layer(s). The structuring of the conductive layer(s) to form the via(s) and/or electrical contact pad(s) and/or conductor tracks may be performed during deposition or later by applying appropriate structuring methods.

The electrical devices described herein may comprise an insulating layer and a via extending through an opening of the insulating layer to electrically connect to the routing line. The via may be formed of a single opening or hole. The via is electrically conductive, i.e. electrical signals or electrical power may be transferred through the via. To this end, the one or more holes forming the via may be filled or coated with an electrically conducting material. The electrically conducting material passing the via may be composed of any desired electrically conducting material, for example, of a metal, such as copper, aluminum, titanium, gold, silver, palladium, platinum, nickel, chromium, or nickel vanadium, a metal alloy, solder, or an electrically conducting organic material. Vias as described herein may form part of a redistribution structure (RDL) comprising one or more structured conducting layers separated by polymer layers and interconnected by the vias.

The electrical devices described herein may include electrical contact pad(s) such as, e.g., bond pads. The electrical contact pad(s) may represent the external terminals of the electrical device. They may be accessible from outside the electrical device and may thus allow electrical contact to be made with electrical component(s) of the electrical device such as, e.g., semiconductor chip(s) from outside of the device. In one embodiment, the electrical contact pad(s) may be bond pads, for instance bond pads of a device package. In one embodiment, the electrical contact pad(s) may be bond pads on which solder deposits are placed, e.g., so-called "ball pads". Such solder deposits may then represent the external terminals of the electrical device.

Furthermore, the electrical contact pad(s) may be thermally conductive and may serve as heat sinks for dissipating the heat generated by the component(s) of the electrical device. The electrical contact pad(s) may be composed of any desired electrically conductive material, for example, of a metal, such as copper, aluminum or gold, a metal alloy or an electrically conductive organic material.

Figure 1:
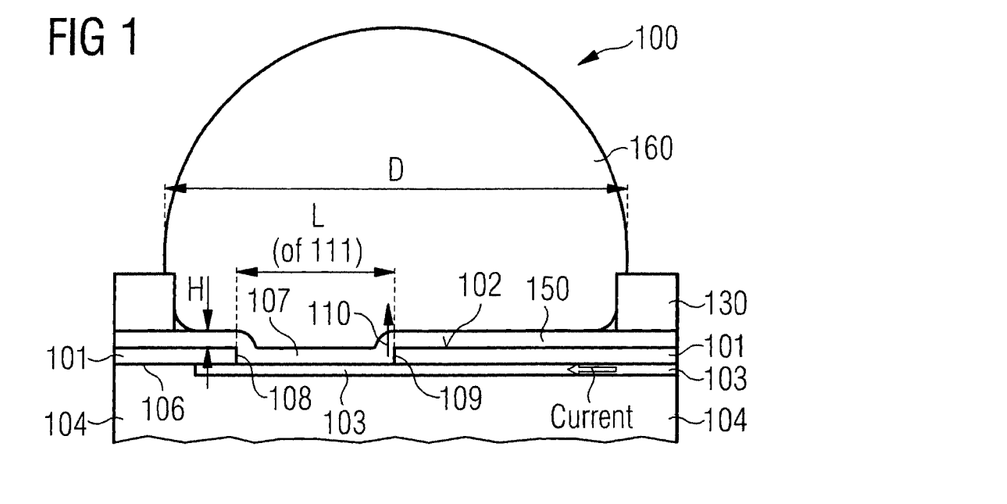
FIG. 1 is a schematic cross-sectional view of an interconnection between a routing line, a via and a solder deposit of an electrical device in accordance with one embodiment.

FIG. 1 is a schematic cross-sectional view of a part of an electrical device 100 in accordance with one embodiment. A routing line 103 made of an electrically conducting material such as, e.g., a metal or a metal alloy extends in a semiconductor chip 104. The routing line 103 forms part of the internal wiring (not further illustrated) of the semiconductor chip 104. The internal wiring may interconnect the routing line 103 to an integrated circuit (not illustrated) implemented in the semiconductor chip 104. The routing line 103 may be structured from the so-called last metal of the internal wiring of the semiconductor chip 104, i.e., the uppermost metal layer integrated within the semiconductor chip 104.

A layer 101 of an insulating material is arranged over an upper surface 106 of the semiconductor chip 104 and over the routing line 103. The insulating layer 101 may be made of one or more dielectric materials. By way of example, it may comprise one or more of a hard passivation layer and a polymer layer. In one embodiment, the upper surface 106 of the semiconductor chip 104 may abut and directly contact the insulating layer 101. In one embodiment, the insulating layer 101 may abut and directly contact the routing line 103.

A via 107 extends through the insulating layer 101. The via 107 is electrically conductive. The via 107 electrically connects to the routing line 103. The via 107 may be implemented by a recess or outcut 108 of the insulating layer 101. The recess or outcut 108 is filled with or the walls of the recess or outcut 108 is coated with an electrically conducting material such as, e.g., a metal, a metal alloy, solder, or an electrically conducting polymer.

An electrical contact pad 150 may be arranged over the insulating layer 101 and over the outcut 108 thereof containing the via 107. Thus, the via 107 may electrically connect the electrical contact pad 150 to the routing line 103. The electrical contact pad 150 may be made of an electrically conducting material such as, e.g., a metal, a metal alloy, solder, or an electrically conducting polymer. The electrical contact pad 150 may extend directly on an upper surface 102 of layer 101.

As illustrated by way of example in FIG. 1, the via 107 and the electrical contact pad 150 may be formed of one and the same conductive layer. In this case, the via 107 and the electrical contact pad 150 are made of the same material(s) and are integral, i.e., the via 107 can be considered to form an integral part of the electrical contact pad 150. That way, the via 107 and the electrical contact pad 150 may be manufactured by the same deposition process(es). However, it is also possible that the via 107 and the electrical contact pad 150 are made of different materials and are manufactured in separate processes, e.g., by first filling the outcut 108 with a via metal and then plating the electrical contact pad 150 with a contact pad metal, which may be different from the via metal.

A solder deposit 160 such as, e.g., a solder bump or solder ball may be arranged over the insulating layer 101 and attached to the electrical contact pad 150. The solder deposit 160 may represent an external terminal of a package accommodating the semiconductor chip 104. The solder deposit may have a maximum lateral dimension or diameter of D. A dielectric layer 130 may be arranged over the conductive layer of which the electrical contact pad 150 is formed. The dielectric layer 130 may have an opening to expose the electrical contact pad 150. Thus, the dielectric layer 130 may serve as a solder stop layer. It may be made of the same material(s) as the insulating layer 101. The routing line 103, the insulating layer 101, the electrical contact pad 150, the solder deposit 160 and the dielectric layer 130 may each be in direct contact to the respective adjacent layer(s) or structures, or may be separated by intermediate layers such as, e.g., adhesion layers, or by multiple polymer and/or conductive layers of a multi-layer RDL from the respective adjacent layer(s) or structures.

The via 107 is configured to transport electrical current between the routing line 103 and the solder deposit 160. Current flowing between the routing line 103 and the solder deposit 160 tends not to use the entire area offered by the via 107. Rather, the current prefers a "shortest" path in the vicinity of a front edge 109 of the via 107 as illustrated by the arrow 110. The front edge 109 of the via 107 is defined by a portion of the outline of the via 107 within a plane defined by the upper surface 102 of the insulating layer 101, with the portion facing the direction of the routing line 103 from which the current arrives. That is, the front edge 109 of the via corresponds to an edge of the outcut 108 of the insulating layer 101. In FIG. 1, the current flows from the right hand side of the routing line 103 to the left hand side, and therefore, the front edge 109 of the via 107 corresponds to the right hand side edge of the outcut 108.

In other words, an electrical device 100 as illustrated in FIG. 1 may exhibit a zone of high current density in the vicinity of front edge 109 and the arrow 110. Such zone of high current density may cause enhanced electromigration at the interface between the via 107 and the solder deposit 160 and may limit the life time of the electrical device 100.

It is to be noted that the electrical conductivity of solder is typically lower than the electrical conductivity of the material of which the electrical contact pad 150 is made. By way of example, the electrical conductivity of the solder of solder deposit 160 may be at least five times lower than the electrical conductivity of the material of which the electrical contact pad 150 is made. The smaller the vertical dimension H (height or thickness) of the electrical contact pad 150, the more current density enhancement (relative to the nominal current density on the assumption of a constant current density distribution across the interface area) and electromigration is to be expected. An interface cross section area 111 of the via 107 is defined by a peripheral line of the outcut 108 in the insulating layer 101, i.e. a section of the conductive via 107 through a plane defined by the upper surface 102 of the insulating layer 101. A horizontal dimension of the interface cross section area 111 of the via 107 in the direction of the routing line 103 is denoted by L (length). In FIG. 1, by way of example, the thickness H of the electrical contact pad 150 corresponds to the thickness of the insulating layer 101, and therefore, outcut 108 of the insulating layer 101 is filled up to the plane defined by the upper surface 102 of the insulating layer 101 with conductive material. In general, however, the thickness H of the electrical contact pad 150 may be smaller or greater than the thickness of the insulating layer 101. Further, the thickness H of the electrical contact pad 150 may be approximately constant across the entire extension of the contact pad inside and outside of the outcut 108.

FIGS. 2-9 illustrate top views of the device 100 according to various embodiments, the electrical devices in FIGS. 2-9 are denoted by reference numbers 200, 300, 400, 500, 600, 700, 800, 900. In all embodiments electromigration is reduced by virtue of a specific design of the via 107 (or, correspondingly, outcut 108) and/or a specific design of the routing line 103 or both. All FIGS. 2-9 illustrate the top view outline of the routing line 103, the top view outline of the interface cross section area 111 of the via 107 and the top view outline of the solder deposit 160 of diameter D. Thus, in other words, FIGS. 2-9 may be interpreted to illustrate the solder deposit 160, the electrical contact pad 150 and the layer 101 of an insulating material as transparent structures under which the interface cross section area 111 of via 107 and the routing line 103 are visible. Further, it is to be noted that in FIGS. 2-9 a notation of reference numbers is chosen to denote structurally identical or similar parts with reference numbers of conforming last two digits. Thus, reference numbers having identical last two digits designate corresponding similar parts and the description of any one of these parts may apply to the similar parts shown in other figures if not stated otherwise or technically excluded.

Figure 2:
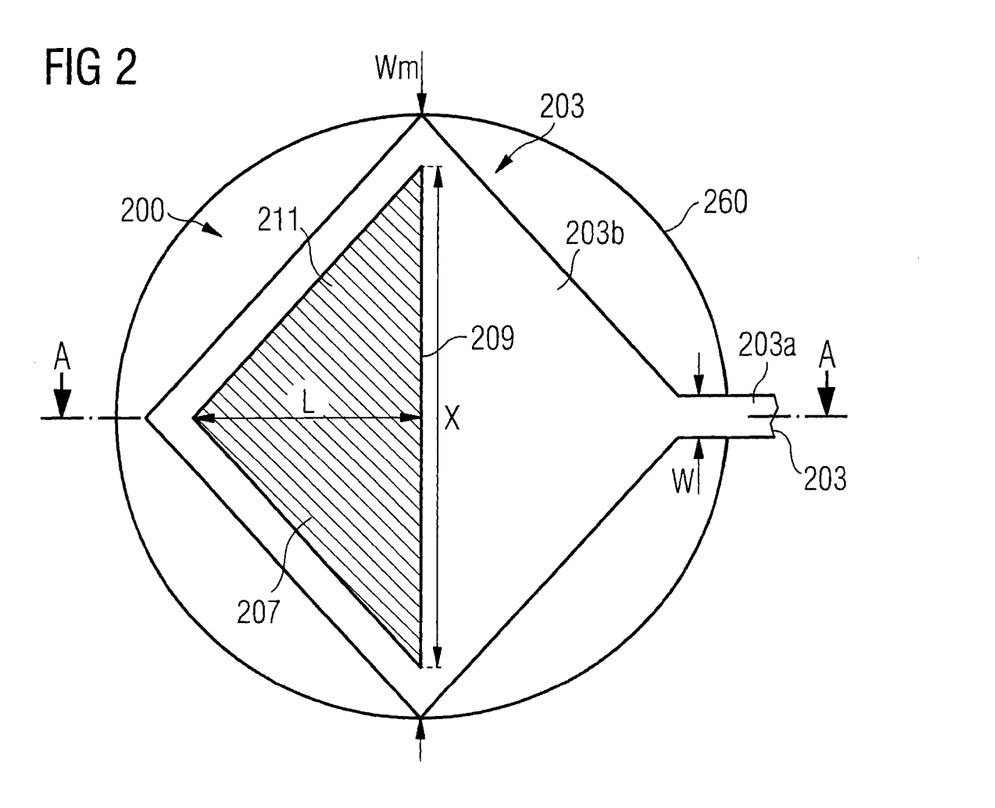
FIG. 2 is a schematic top view of an interconnection between a routing line, a via and a solder deposit of an electrical device in accordance with one embodiment.

According to FIG. 2, routing line 203 (corresponding to routing line 103) may be composed of a line section 203a and a contact section 203b. The line section 203a may, e.g., have an elongated shape such as the shape of a line or a stripe. The width W of the line section 203a of the routing line 203 may be more or less constant along the extension of the line. By way of example, the width W of the line section 203a may be about a few, ten, or some tens of μm, e.g., 5 μm-70 μm, or 20 μm-50 μm, or about 35 μm. By way of example, the line section 203a of the routing line 203 may be a signal or power line implemented in the last metal wiring layer of an integrated circuit (IC) formed in the semiconductor chip 104. Instead of a line, an IC-via array of same width W can be used also.

The lateral dimension or width W of the routing line 203 increases when the routing line 203 approaches the via 207. More specifically, as illustrated in FIG. 2, a contact section 203b of an increasing width of the routing line 203 starts where the line section 203a of substantially constant width W ends. In the embodiment shown in FIG. 2, the contact section 203b may continually increase in width towards a front edge 209 (corresponding to front edge 109) of the via 207.

The contact section 203b may have a first portion connecting to the line section 203a defined by two edges departing from each other under an angle α of, e.g., about 50-180°, more particularly 80-150°, e.g., about 90°. By way of example, the contact section 203b may have a square or quadratic shape with the line section 203a of the routing line 203 connecting to a corner of the square or quadratic contact section 203b. The expanding width W of the routing line 203 allows the current to homogeneously distribute over a large lateral area when hitting the via 207 at the vertical projection of the front edge 209 facing the line section 203a of the routing line 203.

Via 207 may have a specific design. By way of example, the via 207 may have a triangular shape. As illustrated in FIG. 2, the via 207 may have a front edge 209 facing the line section 203a of the routing line 203. The front edge 209 may, e.g., be shaped as a substantially straight line. The front edge 209 may be orientated substantially in a perpendicular direction to the main direction of current flow, which may correspond to the axis of the line section 203a and/or to the axis of the contact section 203b of the routing line 203. In one embodiment, the axis of the line section 203a and the axis of the contact section 203b are collinear and are both represented by axis A-A as shown in FIG. 2. Axis A-A may also correspond to the main direction of current flow and further corresponds to the cross-sectional axis of FIG. 1. Generally, the axis of the line section 203a and the axis of the contact section 203b need not to be collinear but may be parallel or inclined to each other. Further, line section 203a of the routing line 203 must not necessarily connect to the contact section 203b of the routing line 203 at a corner thereof.

The front edge 209 of the via 207 runs from two corners or bends of the triangle and may have a length X. X may correspond to the maximum width of the via 207 at the interface cross section area 211, if the maximum width of the via 207 occurs along the length of the front edge 209 as, for instance, shown in FIG. 2. The front edge 209 may be arranged perpendicular to the dimension of (maximum) length L of the interface cross section area 211.

A maximum width Wm of the routing line 203, more specifically, of the contact section 203b of the routing line 203, may be greater than the length X of the front edge 209. In one embodiment, e.g., as shown in FIG. 2, a line of maximum width Wm of the routing line 203 may coincide with a line defined by the front edge 209. In one embodiment the line of maximum width Wm may intersect or extend in the vicinity of the (straight or curved) line defined by front edge 209.

The length L of via 207 may be smaller than the length X of the front edge 209. The line defined by the maximum lateral dimension (in FIG. 2 length X) of the via 207 at the interface cross section area 211 may be oriented perpendicular to the line of minimum lateral dimension of the via 207 at the interface cross section area 211.

Due to the shape of the contact section 203b of the routing line 203 and/or the shape of the via 207 at the interface cross section area 211, current flowing from the routing line 203 into the via 207 and from the via 207 into the solder deposit 260 is offered plenty of space in a lateral direction to homogeneously distribute across the length X of front edge 209. That way, the sheet current density at each point across the front edge 209 is considerably low. As compared to a standard via of the same interface area but having a circle-shaped outline, the maximum sheet current density may be reduced, e.g., from about 450 A/mm$^2$ to about 200 A/mm$^2$ at the front edge 209 of via 207. Thus, electromigration between the via and the solder is minimized. Ideally, the front edge 209 extends along a line with identical sheet current density. In this case, the front edge 209 may have a concave curvature similar to FIG. 6.

By way of example, for all embodiments if not mentioned otherwise, the length L may be between 5 and 100 μm, more particularly between 10 and 50 μm and, e.g., about 25 μm. The length X may be greater than 50 μm, e.g., between 50 and 300 μm, more particularly greater than 100 μm, e.g., between 100 and 200 μm, and, e.g., about or greater than 150 μm. The lateral dimension or diameter D of the solder deposit may be between 50 and 350 μm, more particularly between 150 and 300 μm and, e.g., about 250 μm.

Figure 3:
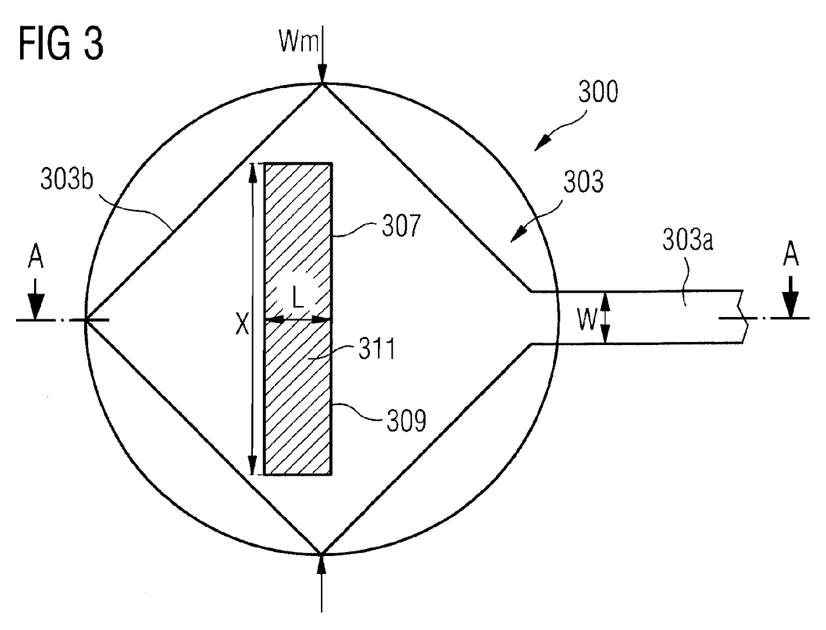
FIG. 3 is a schematic top view of an interconnection between a routing line, a via and a solder deposit of an electrical device in accordance with one embodiment.

FIG. 3 illustrates a schematic top view of an embodiment interconnection between a routing line 303 and via 307 of an electrical device 300 in accordance with one embodiment. The cross-sectional view shown in FIG. 1 of electrical device 100 is also a cross-sectional view of device 300 shown in FIG. 3. Further, the routing line 303 containing the line section 303a and the contact section 303b may be formed and designed in a manner identical to the routing line 103, 203 shown in FIGS. 1 and 2. The via 307 is identical to vias 107, 207 except that via 307 has a rectangular cross-section through the first surface 102 of the insulating layer. Consequently, the interface cross section area 311 of via 307 has a rectangular shape. The dimensions L, X of the interface cross section area 311 and the dimensions W and Wm of the routing line 303 may be the same as mentioned above with reference to FIGS. 1 and 2.

Front edge 309 of via 307 is defined by a portion of the outline of the interface cross section area 311 between two corners or bends thereof, with the portion facing the direction of main current flow in the routing line 303. Again, the front edge 309 is a substantially straight line having, e.g., a length of X and, e.g., extending along the maximum width of the via 307 at the interface cross section area 311.

Figure 4:
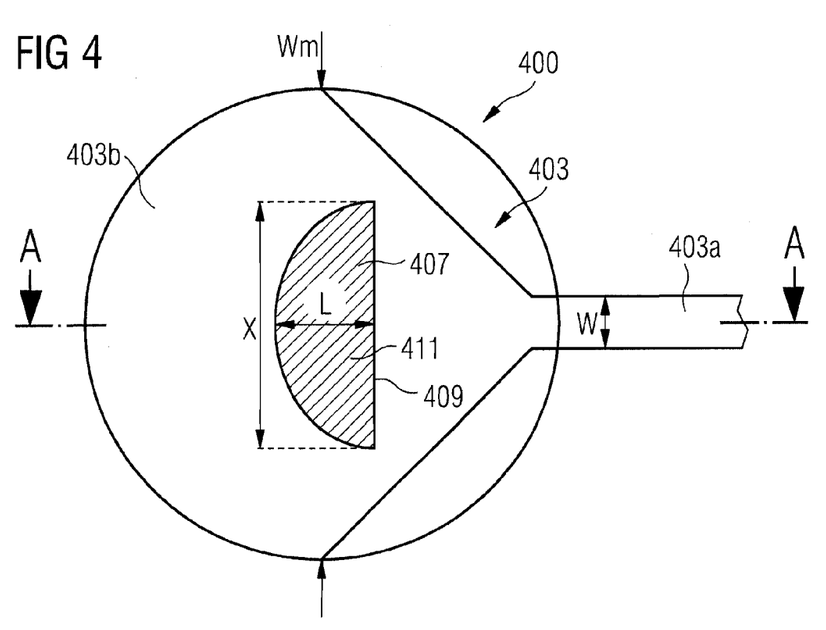
FIG. 4 is a schematic top view of an interconnection between a routing line, a via and a solder deposit of an electrical device in accordance with one embodiment.

FIG. 4 illustrates a schematic top view showing routing line 403 and a via 407 of an electrical device 400 in accordance with one embodiment. A cross-sectional view of electrical device 400 along line A-A is illustrated in FIG. 1 and may be identical to the cross-sectional view along lines A-A of the embodiments described above.

The routing line 403 may comprise a line section 403a and a contact section 403b. The line section 403a and the contact section 403b may be identical to the line sections 103a, 203a, 303a and the contact sections 103b, 203b, 303b, respectively, of the aforementioned embodiments.

The via 407 may be identical to the vias 107, 207, 307 as described above except that via 407 has a half-round or arcuate shaped cross-section area 411 through the upper surface 102 of the insulating layer 101. The dimensions L, X of the interface cross section area 411 and the dimensions W and Wm of the routing line 403 may be the same as in the aforementioned embodiments.

In accordance with the aforementioned embodiments, a front edge 409 of via 407, which may face the line section 403a of the routing line 403 and may extend over the full width of the interface cross section area 411, may be shaped as a substantially straight line having a length X. Another edge portion of via 407 at the interface cross section area 411 opposite to the front edge 409 may have an arcuate shape.

Figure 5:
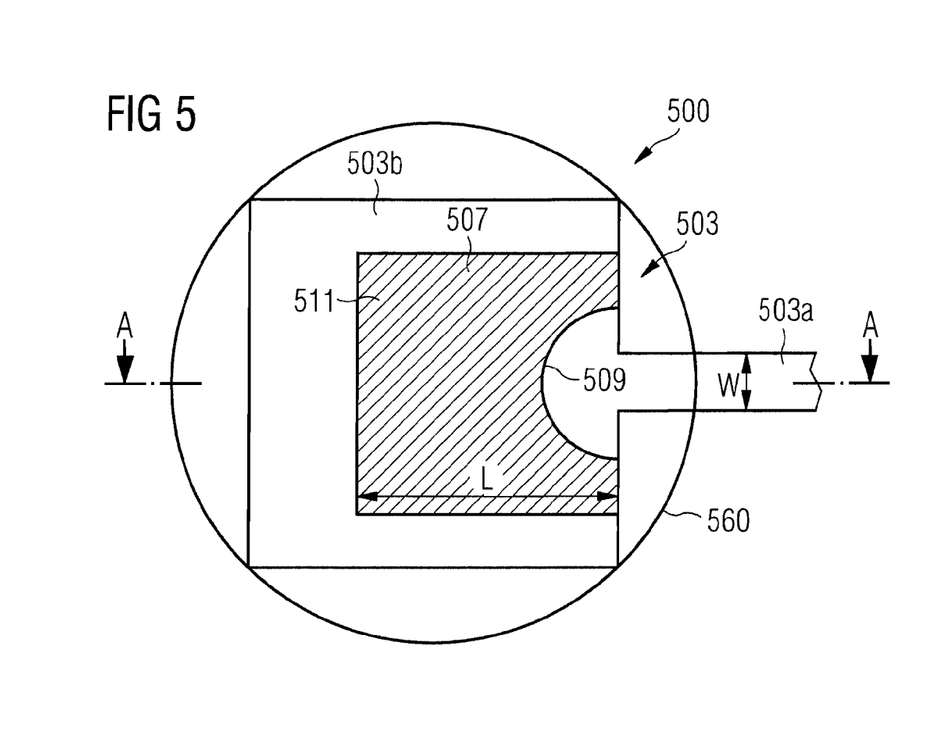
FIG. 5 is a schematic top view of an interconnection between a routing line, a via and a solder deposit of an electrical device in accordance with one embodiment.

According to FIG. 5, a routing line 503 may have a line section 503a and a contact section 503b. The line section 503a may be manufactured and shaped identical to the line sections 103a, 203a, 303a and 403a as described above. The contact section 503b may have a rectangular or square shape. All further particulars described above in relation to the routing lines 103-403 may also be applied to routing line 503, except that in this example the line section 503a connects to the contact section 503b at about a mid-point of one side of the contact section 503b rather than at a corner thereof. FIG. 1 illustrates a cross-section of electrical device 500 along line A-A as shown in FIG. 5.

Via 507 may have a predominantly rectangular or quadratic shape with an arcuate recess being provided at the side of the via 507 which faces the line section 503a of the routing line 503. The arcuate recess defines a front edge 509 which runs from two corners or bends of the outline of the interface cross section 511 and may have a length X. The dimensions L, X, W, Wm may be identical to the corresponding dimensions of the aforementioned embodiments. Ideally, the front edge 509 extends along a line with identical sheet current density. In this case, the front edge 509 may have a concave curvature similar to FIG. 6.

As already depicted in other figures illustrating a top view of an interconnection between a routing line, a via and a solder deposit, the front edge 509 of via 507 at the interface cross section area 511 defines a transition line for current flowing between the via 507 and the solder deposit 560, where electromigration is reduced due to the concave curvature of front edge 509 and the considerable length X over which the current flow may distribute to reduce the sheet current density.

In other words, front edge 509 of the via 507 faces the line section 503a of the routing line 503. Thus, the front edge 509 has an arcuate, curved, semicircular, or semi-oval shape, allowing the current to distribute over a wide lateral area before entering the via 507 and on leaving the via 507 to enter the solder deposit 560. The length X of the arcuate, curved, semicircular, or semi-oval edge 509 may, e.g., be approximately the same as the maximum lateral dimension of the via 507, or may even be greater. Other particulars of electrical device 500 may be identical to the corresponding particulars of other embodiments described herein and the description thereof is omitted for the sake of brevity.

By way of example, employing a front edge 509 of semicircular shape as shown in FIG. 5, i.e., an equal distance from the end of the line section 503a to the front edge 509 of the via 507, allows for a sheet current density reduction by a factor of 4 at the front edge 509 compared to a standard via of the same interface cross section area but having a circle-shaped outline.

Figure 6:
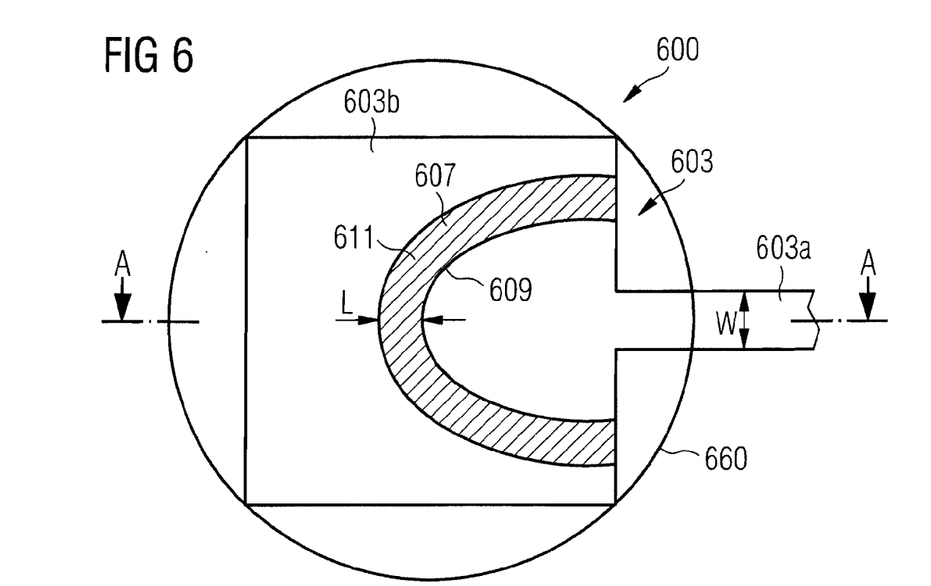
FIG. 6 is a schematic top view of an interconnection between a routing line, a via and a solder deposit of an electrical device in accordance with one embodiment.

According to FIG. 6, in one embodiment an electrical device 600 may feature an interface cross section area 611 of via 607 having an overall shape similar to a semi-circle or semi-oval. Accordingly, in this embodiment the length L may be smaller than in the embodiments described above. The length X of the front edge 609 of via 607 at the interface cross section area 611 may be similar to the corresponding dimensions X of aforementioned embodiments. By way of example, the routing line 603 may have a line section 603a and a contact section 603b, the line section 603a and the contact section 603b having the same shape as the line section 503a and the contact section 503b of the electrical device 500. Further, similar to the electrical device 500, the via 607 has a front edge 609 defined by a portion of the outline of the via 607 which faces the main direction of current flow, e.g., the line section 603a of the routing line 603. The front edge 609 has a concave curvature. It may have a shape similar to the shape of a semi-circle or a semi-oval. Other types of arcuate shapes are also possible. Similarly to the embodiment shown in FIG. 5, the current, when leaving the line section 603a of the routing line 603 and flowing towards the via 607, may distribute over a wide spatial and longitudinal area before entering the via 607, so that the sheet current density at the front edge 609, when leaving the via 607 and entering the solder deposit 660, is reduced. Ideally, the front edge 609 extends along a concave line with identical sheet current density.

By way of example, shaping the via 607 to a semi-oval stripe as shown in FIG. 6, with a longitudinal dimension greater than the lateral dimension allows for a current density reduction by a factor of about 10 compared to a standard via of the same interface cross section area but having a circle-shaped outline.

Figure 7:
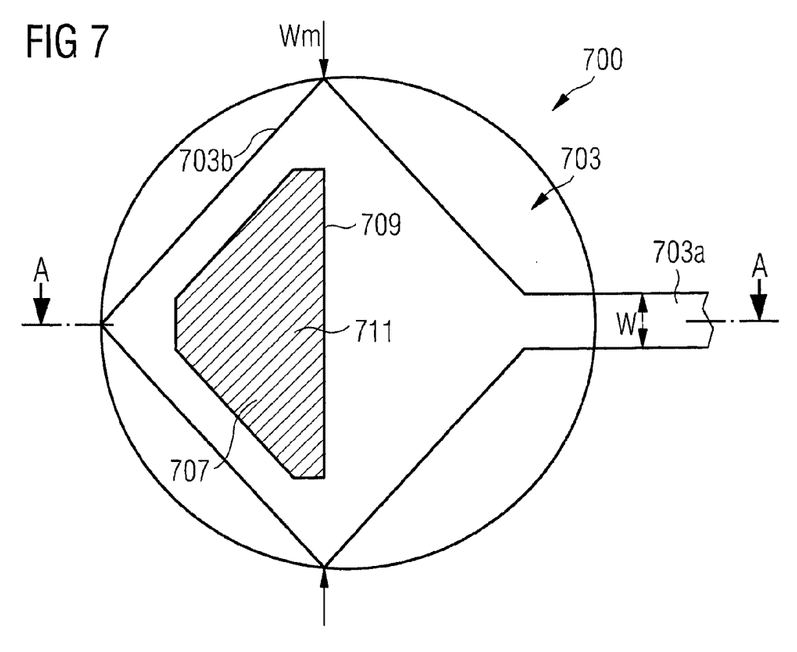
FIG. 7 is a schematic top view of an interconnection between a routing line, a via and a solder deposit of an electrical device in accordance with one embodiment.

FIG. 7 is a schematic top view of an electrical device 700 having a routing line 703 and a via 707, the interface cross section area being denoted by reference numeral 711. The routing line 703 may comprise a line section 703a and a contact section 703b, which have already been described with reference to aforementioned embodiments. The via 707 may have a front edge 709 facing the line section 703a of the routing line 703. Similar to the embodiments illustrated in FIGS. 2-4, the front edge 709 is designed as a substantially straight line oriented substantially perpendicular to an axis of the line section 703a of the routing line 703. Here, by way of example, the length X of the front edge 709 is identical to the maximum lateral dimension of the via 707 at the interface cross section area 711. However, in one embodiment, the length X of the front edge 709 may be greater than the maximum lateral dimension of via 707, e.g., if the front edge 709 has a curved shape as, e.g., illustrated in FIGS. 5 and 6. The electrical device 700 shown in FIG. 7 may be similar or identical to the electrical devices 100, 200 shown in FIGS. 1 and 2 with the exception that one or more of the corners of the triangle-shaped interface cross section area 711 are cut.

Figure 8:
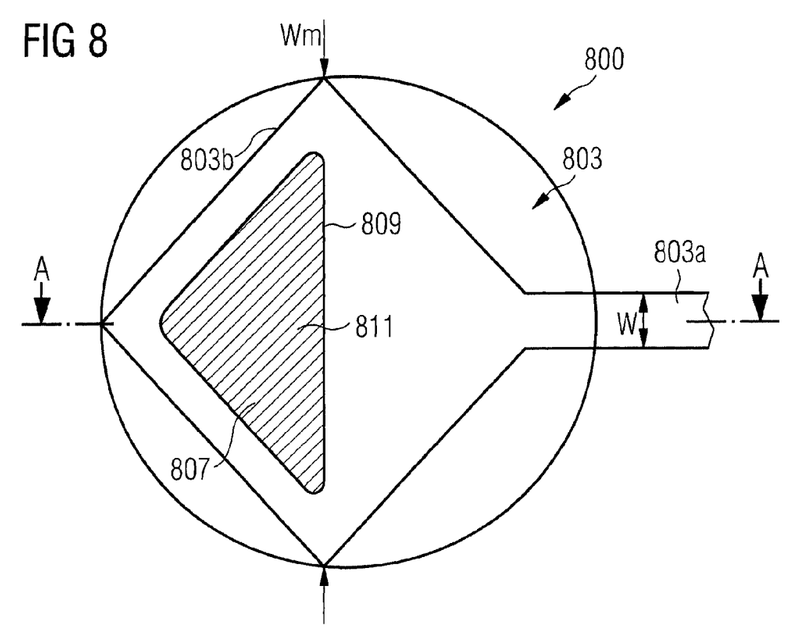
FIG. 8 is a schematic top view of an interconnection between a routing line, a via and a solder deposit of an electrical device in accordance with one embodiment.

According to FIG. 8, the corners of interface cross section area 811 may be rounded. In FIG. 8, the contact section 803b and the line section 803a of the routing line 803 may be similar to aforementioned embodiments, see, e.g., FIG. 7. The front edge of the via 807 at the interface cross section area 811 is denoted by reference numeral 809 and may be implemented, e.g., by a straight line (see FIG. 8) running between two bends of the outline of the interface cross section area 811 or by a curved line as depicted, e.g., in FIG. 5 or 6. All dimensions W, Wm, X, L may have similar or identical values as in the aforementioned embodiments.

Further, it is to be noted that specific shapes of vias 107, 207, 307, 407, 507, 607, 707, 807 and routing lines 103, 203, 303, 403, 503, 603, 703, 803 may be mixed or interchanged throughout the various embodiments shown in FIGS. 1-8. In all embodiments, corners of the via at the interface at the interface cross section area may be cut or rounded similar to the embodiments illustrated in FIGS. 7 and 8.

In one embodiment which is not illustrated by a Figure, the front edge portion of the via at the interface cross section area may have a slight convex curvature. A slight convex curvature may, for example, be a curvature of a diameter greater than a maximum lateral dimension of the via or a curvature of a diameter greater than a maximum lateral dimension Wm of the routing line or a curvature of a diameter greater than a maximum lateral dimension D of the solder deposit. It is to be noted that a convex curvature of the front edge portion of the via tends to concentrate the current and therefore, in order to maintain small sheet current densities at the front edge of the via, only slightly convex curvatures (at least less than the curvature of a circular via) should be provided.

Figure 9:
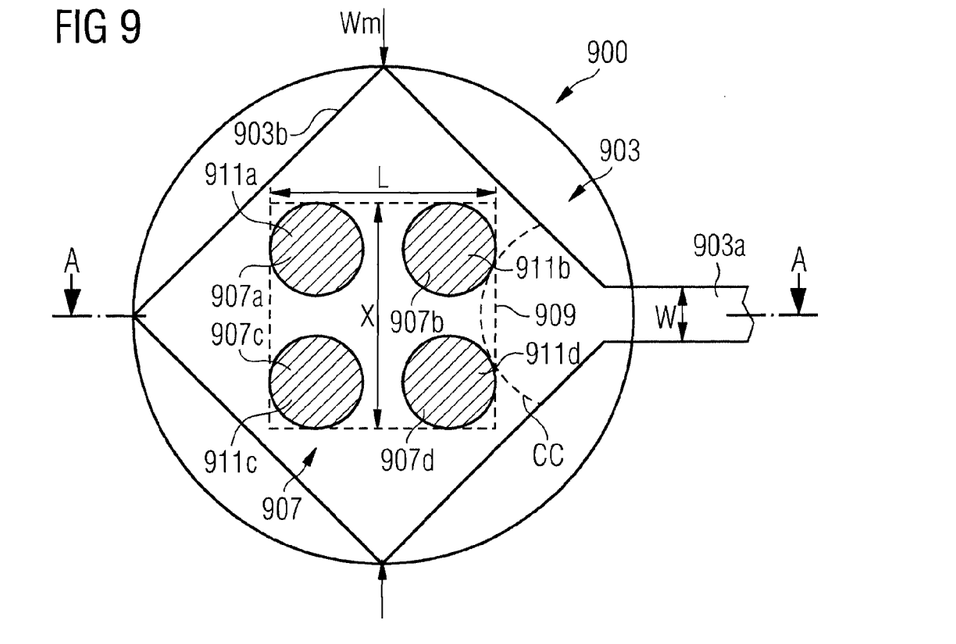
FIG. 9 is a schematic top view of an interconnection between a routing line, a via and a solder deposit of an electrical device in accordance with one embodiment.

FIG. 9 illustrates a schematic top view of an electrical device 900 according to one embodiment. A routing line 903 comprises a line section 903a and a contact section 903b, with the line section 903a directly connecting to a corner of the contact section 903b. For sake of brevity, reference is made to the corresponding description in conjunction with FIGS. 1-4.

Multiple vias 907a, 907b, 907c, 907d are designed to extend through multiple openings in the insulating layer 101 (see FIG. 1), the interface cross section areas thereof in the plane defined by the upper surface 102 of the insulating layer 101 are denoted by reference numerals 911a, 911b, 911c and 911d, respectively. The multiple vias 907a, 907b, 907c, 907d are arranged in a pattern, with an outline of the pattern having, e.g., a polygonal shape. By way of example, as shown in FIG. 9, the outline of via pattern may have a square shape. Reference numeral 909 denotes a front side of the polygon (e.g., of a square as shown in FIG. 9) facing the line section 903a of routing line 903. A longitudinal direction or axis of the line section 903a of routing line 903 may be aligned to a mid-point of the side 909 of the polygon facing the line section 903a. An orientation of the axis of the line section 903a perpendicular to the side 909 of the polygon (square) facing the line section 903a allows the current flowing from or into the routing line 903 to distribute over a comparatively large spatial area when hitting the via pattern. FIG. 9 displays a phantom line CC of constant sheet current density and illustrates that this line approximately matches to the geometry and orientation of the via pattern. In this way, electromigration is minimized at the interface cross section areas 911a, 911b, 911c, 911d.

In other words, the design of multi vias 907a, 907b, 907c, 907d and the design of the routing line 903 may be characterized in that the polygonal (square) outline of the via pattern is rotated in relation to the rectangular outline of the contact section 903b of routing line 903 by a rotating angle of 45°. The lateral dimension X at the front side multi vias 907b, 907d as seen from the routing line 903 is of main importance for the reduction of the maximum sheet current density and could be increased by providing more than two vias (e.g., more than 3, 4 or 5 vias). The backside multi vias 907a, 907b could be omitted. Further, the line section 903a may connect to the contact section 903b of the routing line 903 at a corner thereof.

It is to be noted that multiple vias may also be arranged in an arcuate row to follow a concave line such as, e.g., the phantom line CC of constant sheet current density. In this case, the front edge pattern line portion of the outline of the via pattern may have a concave shape. In FIG. 9, the front side multi vias 907b, 907d follow such a concave line, namely the phantom line CC. In general, more than two vias (e.g., more than 3, 4 or 5 vias) may be arranged in an arcuate row to follow a concave line such as, e.g., the phantom line CC of constant sheet current density in order to reduce the maximum sheet current density. Such front side vias arranged in an arcuate row may form the entire pattern or may be supplemented by backside vias also arranged in an arcuate row within the pattern.

In electrical device 900, all dimensions W, Wm, X, L may have values as described before in relation to other embodiments. Further, FIG. 1 may be interpreted as a cross-section of the electrical device 900 along line A-A with the exception that the multi via 907a, 907b, 907c, 907d does not intersect with line A-A and should thus not be visible in FIG. 1 when taken in combination with FIG. 9.

It is to be noted that in electrical devices 100-900, the contact section of the routing line must not necessarily overlap the whole area or even a partial area of the interface cross section areas in FIGS. 2-9. In some embodiments, the contact section of the routing line may end at or near the "beginning" of the via, i.e., near to the projection of the front edge of the via. Since the effect of electromigration is mainly confined to the front edge of the via, it can be sufficient to geometrically design the via and/or the part of the contact section which extends between the end of the line section and the front edge in accordance with the above teaching.

Further, it is to be noted that in electrical devices 100-900, the vias may have vertical walls. That is, the interface cross section areas depicted in FIGS. 2 to 9 (which are defined by a section through the vias in a plane defined by the upper surface 102 of the insulating layer 101) may correspond to the interface areas between the contact section of the routing lines and the vias.

Figure 10:
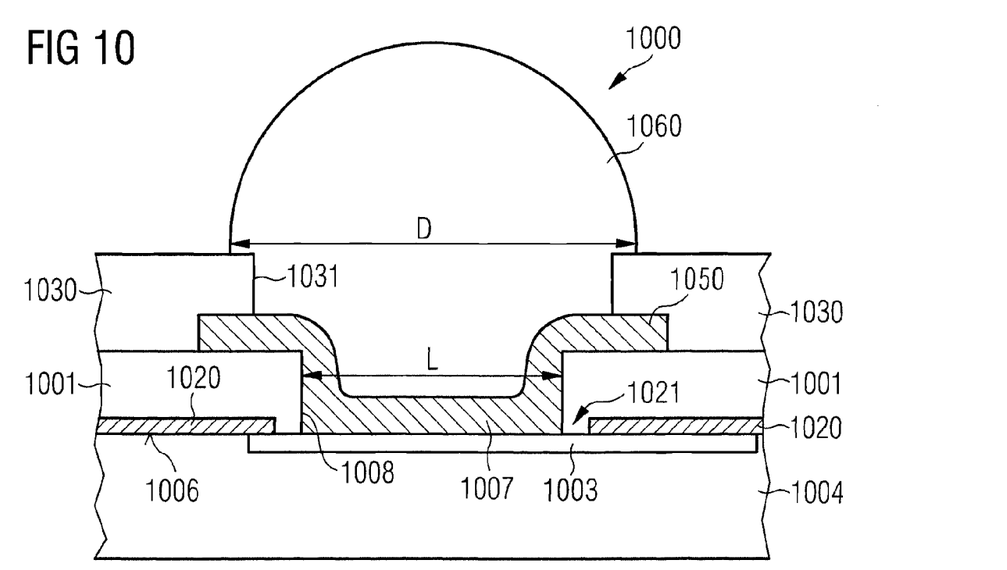
FIG. 10 is a schematic cross-sectional view of an electrical device in accordance with one embodiment.

FIG. 10 is a schematic cross-sectional view of an electrical device 1000 in accordance with one embodiment. Electrical device 1000 may be an implementation of any of the electrical devices 100 to 900 as described above. Vice versa, details described in conjunction with electrical device 1000 may likely apply to electrical devices 100 to 900. Electrical device 1000 may comprise a semiconductor chip 1004 comprising a routing line 1003. The upper surface 1006 of the semiconductor chip 1004 may be coated with a hard passivation layer 1020. The hard passivation layer 1020 may, e.g., be made of an oxide or nitride layer covering the bare semiconductor material surface. The hard passivation layer 1020 may have an opening 1021 exposing a portion of the routing line 1003.

A polymer layer 1001 may be arranged over the hard passivation layer 1020. The polymer layer 1001 may be made of an etch resist and/or an epoxy-based material. By way of example, the polymer layer 1001 may be made of a photoresist such as, e.g., SU8 which is epoxy-based. The polymer layer 1001 may be electrically insulating and/or photosensitive and/or filled by a filler material and may, for example, contain polyimide, silicone, polyurethane, parylene or other appropriate materials.

A conductive layer structured to an electrical contact pad 1050 is arranged over the polymer layer 1001. The conductive layer 1003 may comprise any of the materials and have any of the dimensions and shapes of the conductive layer as described herein with reference to the aforementioned embodiments.

The polymer layer 1001 comprises an opening 1008 containing an electrically conducting via 1007. The via 1007 may be made of any of the materials and may have any of the dimensions and the shapes as described in the aforementioned embodiments. In particular, the via 1007 may form part of the conductive layer 1003 and may be manufactured by a plating process.

A dielectric layer 1030 may be deposited on top of the conductive layer structured into the electrical contact pad 1050. The dielectric layer 1030 may, for instance, be deposited from a gas phase or from a solution, or can be laminated onto the conductive layer forming the electrical contact pad 1050 and the polymer layer 1001. The dielectric layer 1030 may be fabricated from a polymer, such as parylene, photoresist material, imide, epoxy, duroplast, silicone, silicone nitride or an inorganic, ceramic-like material, such as silicon-carbon compounds.

The dielectric layer 1030 may have an opening 1031 to expose a portion of the conductive layer structured to the electrical contact pad 1050. The opening 1031 may, for example, be produced by using photolithographic methods, ablation and/or etching methods. The exposed portion of the structured conductive layer serves as the electrical contact pad 1050. The electrical contact pad 1050 may be an external contact pad or bond pad of a package in which the semiconductor chip 1004 is accommodated.

The conductive layer structured to the electrical contact pad 1050 and the dielectric layer 1030 may form a so-called redistribution structure (RDL). The RDL may not only contain one but a plurality of conductive layers separated by a plurality of intermediate polymer layers to implement a multi-layer RDL. Such RDL may be fabricated by well-known thin-film technology processes and my additionally provide a flexible signal or power routing through conductor tracks and a design of the (external) electrical contact pads 1050 (that is, e.g., the package terminals) tailored to the customer's needs.

A solder deposit 1060 such as, e.g., a solder bump or solder ball may be attached to the electrical contact pad 1050. The solder deposit 1060 may represent an external terminal of a package accommodating the semiconductor chip 1004 or any other electrical component. The passivation layer 1020, the polymer layer 1001, the conductive layer 1003 structured to the electrical contact pad 1050 and the dielectric layer 1030 may each be in direct contact with each other or may be separated by intermediate layers such as, e.g., adhesion layers, etc.

A thickness T of the dielectric layer 1030 (e.g., solder stop layer) may typically be up to 10 µm or even higher. The thickness H of the electrical contact pad 1050 may be smaller than 15 µm, more particularly 10 µm and still more particularly 8 µm. Similarly, the height of the via 1007 may be smaller than 15 µm, more particularly 10 µm and still more particularly 8 µm. It is to be noted that increasing the thickness H of the electrical contact pad 1050 or the height of the via 1007 is an expensive measure and therefore, a small thickness/height is typically envisaged. The polymer layer 1001 may typically have a thickness of about 8 µm. The hard passivation layer 1020 may typically have a thickness of about 1 µm. The routing line 1003 may typically have a thickness of about 0.5 to 3 µm. Dimensions of D, L have already been mentioned above.

Figure 11:
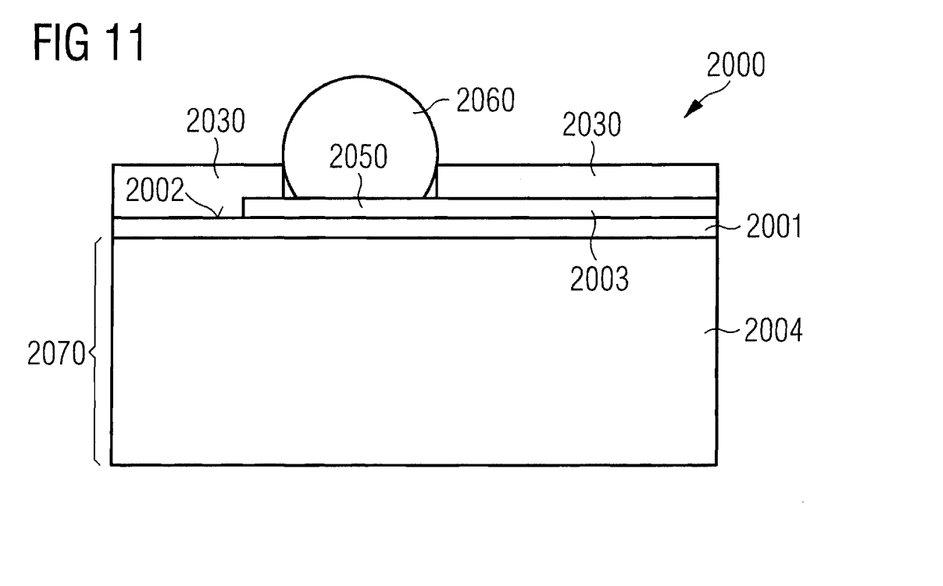
FIG. 11 is a schematic cross-sectional view of an electrical device in accordance with one embodiment.

According to one embodiment as shown in FIG. 11, an electrical device 2000 comprises a structure 2070 having an upper surface 2002. The structure may, e.g., be any kind of substrate for supporting an RDL. It may, e.g., comprise a semiconductor chip 2004 and an insulating layer 2001, wherein the upper surface of the insulating layer 2001 forms the upper surface 2002 of the structure 2070. In this case, the above description of dimensions, materials and other characteristics of the semiconductor chip and/or the layer of an insulating material of the aforementioned embodiments likewise applies to semiconductor chip 2004 and the insulating layer 2001.

An electrically conductive layer structured into one or more conductor track 2003 and an electrical contact pad 2050 may be arranged over the insulating layer 2001. The electrically conductive layer may be made of an electrically conducting material such as, e.g., a metal, a metal alloy, solder, or an electrically conducting polymer. The electrical contact pad 2050 and the one or more conductor tracks 2003 connected to the electrical contact pad 2050 may extend directly on the upper surface 2002 of insulating layer 2001.

A dielectric layer 2030 may be arranged over the conductive layer of which the electrical contact pad 2050 and the one or more conductor tracks 2003 are formed. The dielectric layer 2030 may have an opening to define and expose the electrical contact pad 2050. Thus, the dielectric layer 2030 may serve as a solder stop layer. It may be made of the same material(s) as the dielectric layer of the aforementioned embodiments and as the insulating layer 2001. The conductor track(s) 2003, the insulating layer 2001, the electrical contact pad 2050 and the dielectric layer 2030 may each be in direct contact to the respective adjacent layer(s) or structures, or may be separated by intermediate layers such as, e.g., adhesion layers, or by multiple polymer and/or conductive layers of a multi-layer RDL from the respective adjacent layer(s) or structures. In other words, the insulating layer 2001 (e.g., a polymer layer) and the conductive layer (e.g., a metal layer) structured to the electrical contact pad 2050 and conductor tracks 2003 may form part of an RDL which may comprise a stack of multiple alternating insulating layers 2001 and conductive layers.

A solder deposit 2060 such as, e.g., a solder bump or solder ball may be attached to the electrical contact pad 2050. The solder deposit 2060 may represent an external terminal of a package accommodating the structure 2070. The dimensions, materials and characteristics of solder deposit 2060 may be the same as mentioned herein before with respect to embodiments.

Figure 12:
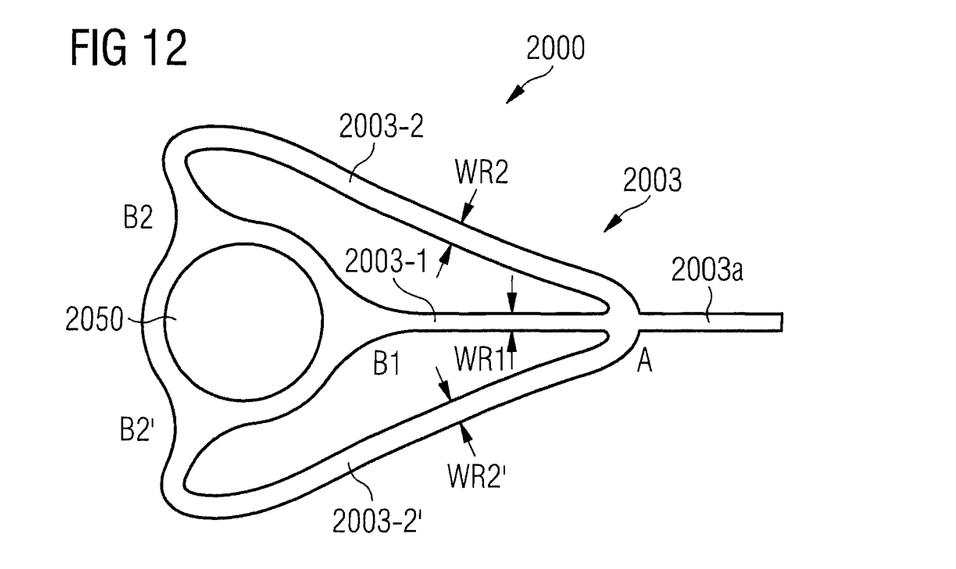
FIG. 12 is a schematic top view of an interconnection between a conductor track and a bond pad of an electrical device in accordance with one embodiment.

FIG. 12 is a schematic top view of electrical device 2000. FIG. 12 illustrates an interconnection between conductor track 2003 and the electrical contact or bond pad 2050 of electrical device 2000. Conductor track 2003 may have an elongated line section 2003a. The conductor track 2003 has a branching A. The branching A partitions the conductor track 2003 into at least two conductor track branches with each of the at least two conductor track branches connecting to the electrical contact pad 2050 at a different location. In FIG. 12 three conductor track branches 2003_1, 2003_2, 2003_2' are illustrated with conductor track branch 2003_1 connecting to the electrical contact pad 2050 at B1, conductor track branch 2003_2 connecting to the electrical contact pad 2050 at B2 and conductor track branch 2003_2' connecting to the electrical contact pad 2050 at B2'. As illustrated by way of example in FIG. 12, the electrical contact pad 2050 may have a substantially rounded shape. Further, the locations B1, B2, B2' may be approximately equidistantly distributed around the periphery of the electrical contact pad 2050.

The length of conductor track branch 2003_1 as measured between A and B1 is smaller than each of the lengths of the conductor track branches 2003_2, 2003_2' as measured between A and B2 and A and B2', respectively. Further, the (minimum) width WR2 of conductor track branch 2003_2 and the (minimum) width WR2' of conductor track branch 2003_2' are greater than the (minimum) width WR1 of conductor track branch 2003_1. The widths of conductor track branches 2003_1, 2003_2 and 2003_2' may each be approximately constant over their lengths. Further, in the example shown, WR2 may be equal to WR2'.

In other words, the shorter the conductor track branch, the smaller the (minimum) width thereof. That way, the (sheet) current densities at the locations B1, B2, B2' hitting the electrical contact pad 2050 are only a fraction (here about ⅓) of the current density which would hit the electrical contact pad 2050 if only one conductor track branch (e.g., conductor track branch 2003_1) would be provided. By way of example, given a current of about 100 mA in the conductor track 2003, the maximum sheet current density hitting the electrical contact pad 2050 could be reduced from about 30 A/mm$^2$ to about 10 A/mm$^2$. Further, by designing the (minimum) width of the conductor track branches 2003_1, 2003_2, 2003_2' in accordance with the rule stated above, it is always possible to provide for approximately equal (sheet) current densities at the locations B1, B2 and B2'.

More specifically, the condition of equal (sheet) current densities at the locations B1, B2 and B2' is approximately satisfied if the electrical resistances of the conductor track branches 2003_1, 2003_2 and 2003_2' are equal. That way, electromigration at the locations B1, B2 and B2' is minimized.

Figure 13:
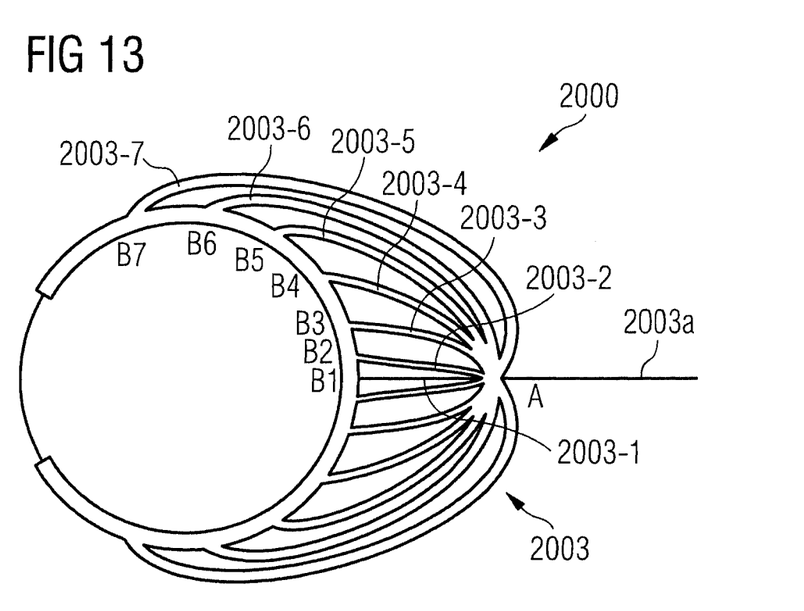
FIG. 13 is a schematic top view of an interconnection between a conductor track and a bond pad of an electrical device in accordance with one embodiment.

FIG. 13 illustrates a schematic top view of an interconnection between conductor track 2003 and an electrical contact (or bond) pad 2050 of electrical device 2000 in accordance with one embodiment. The electrical device 2000 shown in FIG. 13 may be implemented similar to the electrical device 2000 shown in FIGS. 11 and 12. In FIG. 13, the line section 2003a of conductor track 2003 splits into an number of 13 conductor track branches, with the conductor track branches in the upper half of FIG. 13 being designated by reference numerals 2003_$n$, n=1, 2, . . . , 7. Similar to electrical device 2000 as shown in FIG. 12, the longer the conductor track branches 2003_$n$ as measured from branching A to Bn, respectively, the greater the width thereof. Further, the electrical resistance of all conductor track branches 2003_$n$ may be approximately the same. That way, the current flowing from or into the conductor track 2003 is approximately uniformly distributed over the circumference of the contact pad, either over the full circumference or over a portion of, e.g., at least ½, ⅔ or ¾ of the circumference of the electrical contact pad 1150 (corresponding to electrical contact pad 2050).

It is to be noted that a plurality of branchings A at different locations rather than a single common branching A as depicted by way of example in FIGS. 12 and 13 may be provided. Further, the electrical device 2000 concerning the interconnection of a conductor track to an electrical contact pad may be implemented in combination with the electrical devices 100 to 1000 concerning the interconnection of a routing line to a via. In other embodiments, the electrical device 2000 concerning the interconnection of a conductor track to an electrical contact pad may not be implemented in combination with an interconnection of a conductor track to a via as exemplified by electrical devices 100 to 1000.

Figure 14:
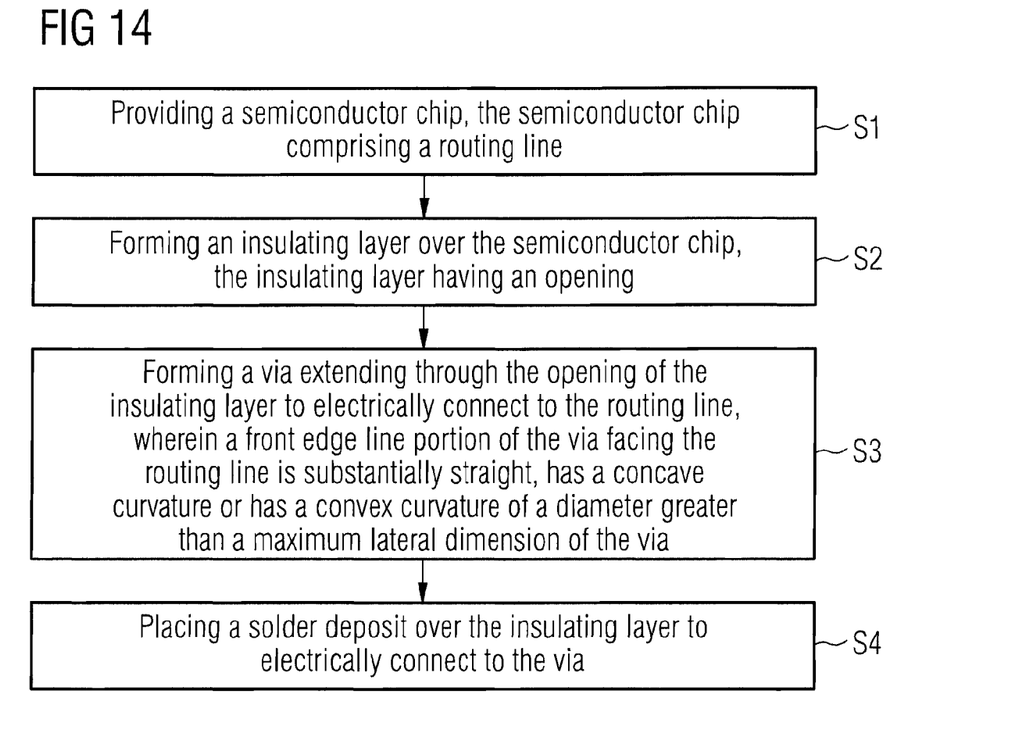
FIG. 14 is a flowchart of an embodiment of a method of manufacturing an electrical device.

According to FIG. 14, a method of manufacturing an electrical device according to embodiments as illustrated in FIGS. 1 to 10 comprises the step S1 of providing a semiconductor chip, the semiconductor chip comprising a routing line.

At step S2, an insulating layer over the semiconductor chip is formed, the insulating layer having an opening.

At step S3, a via extending through the opening of the insulating layer to electrically connect to the routing line is formed. The via is designed such that a front edge line portion of the via facing the routing line is substantially straight, has a concave curvature or has a convex curvature of a diameter greater than a maximum lateral dimension of the via (or, e.g., of the routing line or, e.g., of the solder deposit).

At step S4, a solder deposit is placed over the insulating layer to electrically connect to the via.

Figure 15:
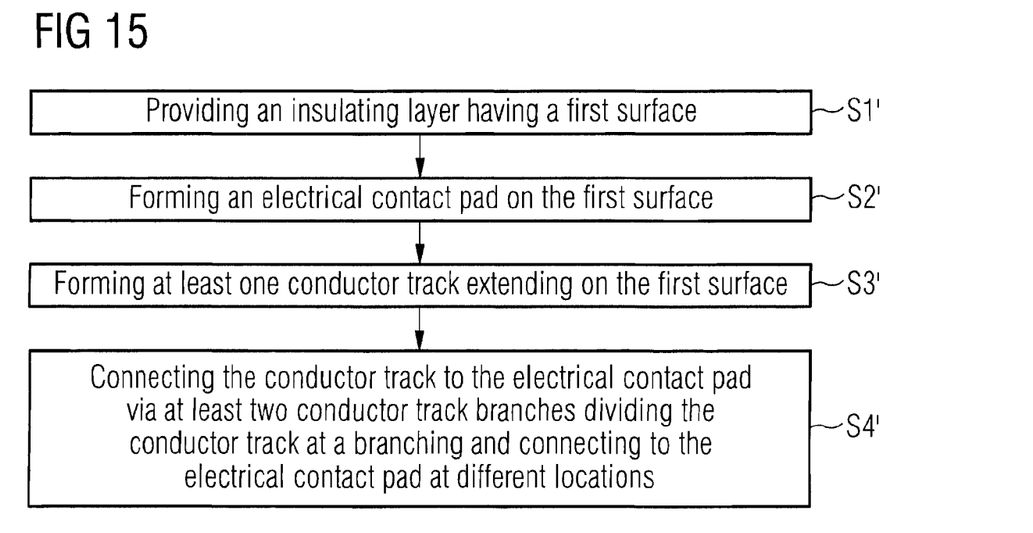
FIG. 15 is a flowchart of an embodiment of a method of manufacturing an electrical device.

According to FIG. 15, a method of manufacturing an electrical device according to embodiments as illustrated in FIGS. 11 to 13 comprises the step S1' of providing an insulating layer having a first surface.

At step S2' an electrical contact pad is formed on the first surface of a structure.

Concurrently, before or after step S2', at least one conductor track extending on the first surface is formed (step S3').

At step S4', the conductor track is connected to the electrical contact pad via at least two conductor track branches dividing the conductor track at a branching and connecting to the electrical contact pad at different locations. Step S4' may be accomplished concurrently or after the steps S2' and/or S3'. Further, in one embodiment, a solder deposit may then be placed on the electrical contact pad.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. By way of example, the design of the conductor tracks 2003 as illustrated in FIGS. 12 and 13 may also apply as a further design of the routing lines 103-1003 as depicted in FIGS. 1 to 10. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electrical device comprising:
a semiconductor chip, the semiconductor chip comprising a horizontal routing line, wherein the routing line comprises a contact section and a line section electrically coupled to the contact section and extending laterally from the contact section;
an insulating layer arranged over the semiconductor chip;
a solder deposit arranged over the insulating layer; and
a via extending through an opening in the insulating layer to electrically connect the contact section to the solder deposit, wherein a horizontal front edge line portion of the via laterally facing the line section is substantially straight, has a concave curvature or has a convex curvature of a diameter greater than a maximum lateral dimension of the via.

2. The electrical device of claim 1, wherein the front edge line portion of the via has a length measured between two bends of the front edge line, the length being greater than 100 μm.

3. The electrical device of claim 1, wherein a cross-section of the via through an upper surface of the insulating layer has one of a rectangular, triangular, oval or half-round shape.

4. The electrical device of claim 1, further comprising an electrically conductive layer arranged over the insulating layer, the electrically conductive layer forming an electrical contact pad for the solder deposit.

5. The electrical device of claim 1, wherein the insulating layer comprises one or both of a hard passivation layer and a polymer layer.

6. The electrical device of claim 1, wherein the front edge line portion of the via has a convex curvature of a diameter greater than a maximum lateral dimension of the routing line or of a diameter greater than a maximum lateral dimension of the solder deposit.

7. The electrical device of claim 1, further comprising multiple vias extending through multiple openings in the insulating layer to electrically connect the routing line to the solder deposit, wherein the multiple vias are arranged in a pattern, an outline of the pattern defining a front edge pattern line portion that is oriented substantially perpendicular to a longitudinal direction of the routing line.

8. The electrical device of claim 4, wherein the electrically conductive layer has a thickness that is smaller than 10 μm.

9. The electrical device of claim 4, wherein the electrically conductive layer fills the opening of the insulating layer to form the via.

10. An electrical device comprising:
a semiconductor chip, the semiconductor chip comprising a routing line, wherein the routing line comprises a contact section and a line section electrically coupled to the contact section and extending laterally from the contact section;
an insulating layer arranged over the semiconductor chip;
a first solder deposit arranged over the insulating layer; and multiple vias extending through multiple openings in the insulating layer to electrically connect the contact section to the first solder deposit, wherein the multiple vias are arranged in a spatial pattern of vias, an outline of the pattern defining a front edge pattern line portion that is oriented substantially perpendicular to a longitudinal direction of line section.

11. The electrical device of claim 10, wherein the front edge pattern line portion of the outline of the pattern has a concave or straight shape.

12. The electrical device of claim 10, wherein a front edge line portion of a via of the multiple vias facing the routing line is substantially straight, has a concave curvature or has a convex curvature of a diameter greater than a maximum lateral dimension of the via.

13. The electrical device of claim 12, wherein the front edge line portion of the via has a length measured between two bends of the front edge line, the length being greater than 100 μm.

* * * * *